(12) United States Patent
Hsieh et al.

(10) Patent No.: US 10,651,380 B1
(45) Date of Patent: May 12, 2020

(54) MEMORY DEVICES AND METHODS OF FORMING THE SAME

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Wanbing Yi, Singapore (SG); Yi Jiang, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/260,215

(22) Filed: Jan. 29, 2019

(51) Int. Cl.
*H01L 45/00* (2006.01)

(52) U.S. Cl.
CPC ...... *H01L 45/1233* (2013.01); *H01L 45/1253* (2013.01); *H01L 45/146* (2013.01); *H01L 45/1616* (2013.01); *H01L 45/1675* (2013.01); *H01L 45/1691* (2013.01)

(58) Field of Classification Search
CPC ............. H01L 45/1233; H01L 45/1253; H01L 45/146; H01L 45/1616; H01L 45/1675; H01L 45/1691

USPC .......................................................... 257/4
See application file for complete search history.

(56) References Cited

U.S. PATENT DOCUMENTS 10,003,022 B2    6/2018  Liu et al.
10,461,126 B2 * 10/2019  Tsai .................... H01L 45/1253

* cited by examiner

*Primary Examiner* — Tu-Tu V Ho
(74) *Attorney, Agent, or Firm* — Viering Jentschura & Partner MBB (57) ABSTRACT

In a non-limiting embodiment, a device may be formed having a substrate that has at least a first region. A base dielectric layer is arranged over the substrate. The base dielectric layer includes an interconnect in the first region. A first electrode is arranged over the interconnect in the first region. A mask structure is arranged over the first electrode. At least one spacer stack is arranged at least partially around the mask structure and the first electrode. The spacer stack(s) includes a resistive switching element at least partially lining sidewalls of the mask structure and the first electrode, and a second electrode arranged over the resistive switching element.

20 Claims, 9 Drawing Sheets

MEMORY DEVICES AND METHODS OF FORMING THE SAME

TECHNICAL FIELD

The present disclosure relates generally to semiconductor devices, and more particularly to non-volatile memory devices and methods of forming the same.

BACKGROUND

Non-volatile memory (NVM) devices, such as resistive random access memory (RRAM) devices, are sensitive and vulnerable to etch processes during fabrication. The etch processes result in etch damage regions, which are very close to the switching region of the resistive memory cell. For example, traditional lithography processes to etch the top electrode and bottom electrode layers in the fabrication of the memory devices results in non-uniformity in the layers near the switching region, which further leads to increased variability in the resistive switching characteristic of the memory device. Such defects in the etch damage regions limit the performance of the memory devices.

From the foregoing discussion, it is desirable to provide memory devices and methods of forming memory devices having switching regions which are free from etch damage caused by etch processes.

SUMMARY

Embodiments generally relate to semiconductor devices and method for forming the semiconductor devices. In some embodiments, a device includes a substrate having at least a first region. A base dielectric layer is arranged over the substrate. The base dielectric layer includes an interconnect in the first region. A first electrode is arranged over the interconnect in the first region. A mask structure is arranged over the first electrode. At least one spacer stack is arranged at least partially around the mask structure and the first electrode. The spacer stack(s) includes a resistive switching element at least partially lining sidewalls of the mask structure and the first electrode, and a second electrode arranged over the resistive switching element.

In some embodiments, a method for forming a device is provided. The method includes providing a substrate having at least a first region. A base dielectric layer is arranged over the substrate. The base dielectric layer includes an interconnect in the first region. A first electrode is formed over the interconnect in the first region. A mask structure is formed over the first electrode. At least one spacer stack is formed at least partially around the mask structure and the first electrode. The at least one spacer stack includes a resistive switching element at least lining sidewalls of the mask structure and the first electrode, and a second electrode arranged over the resistive switching element.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized, and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises,"

"has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to semiconductor devices. More particularly, some embodiments relate to memory devices, such as non-volatile memory (NVM) devices. In a non-limiting embodiment, the memory devices may be or include resistive random access memory (RRAM) devices. In other non-limiting embodiments, the memory devices may be or include magnetic random access memory (MRAM) and/or phase-change random access memory (PCRAM) devices. Embodiments of the present disclosure, as will be described, provide memory devices with switching regions, which are protected from or not exposed to etch processes during fabrication of the memory devices. Further, the electrodes of the memory device are configured to provide smaller and confined switching regions via the switching element, which improves uniformity in the switching characteristic of the memory device. In some embodiments, the memory device may be a cross-point memory array having shared contacts, which increases cell density in the memory array. Such memory devices, for example, may be incorporated into or used with, for example, consumer electronic products such as smartphones, or related to other types of devices and applications including, for example, automotive applications.

Figure 1A:
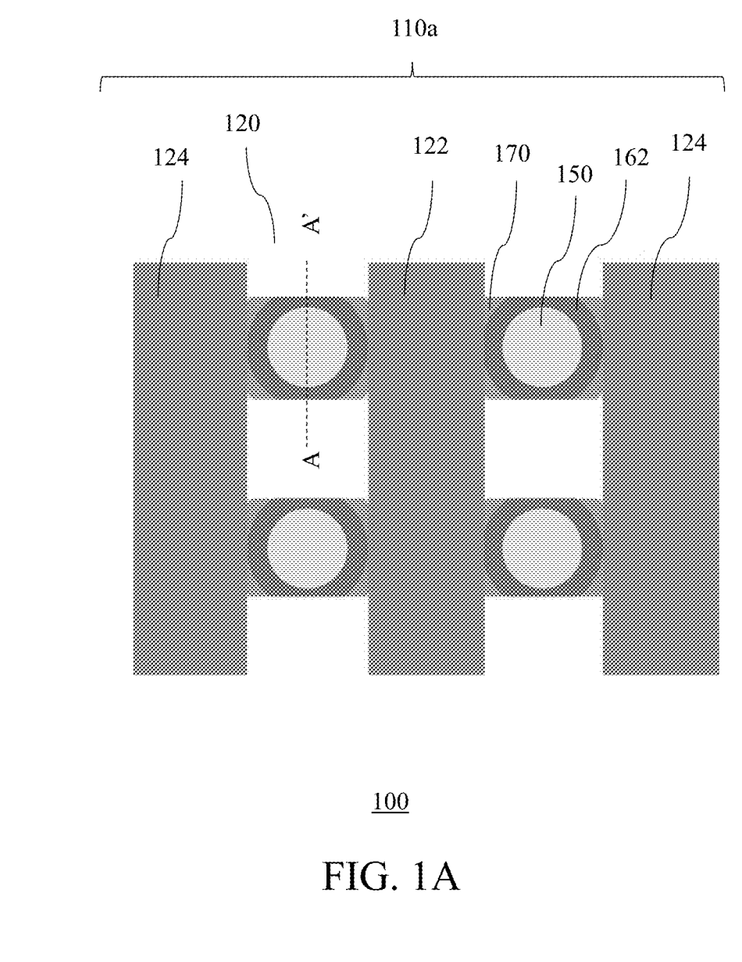
FIG. 1A shows a simplified top view of an embodiment of a device.
Figure 1B:
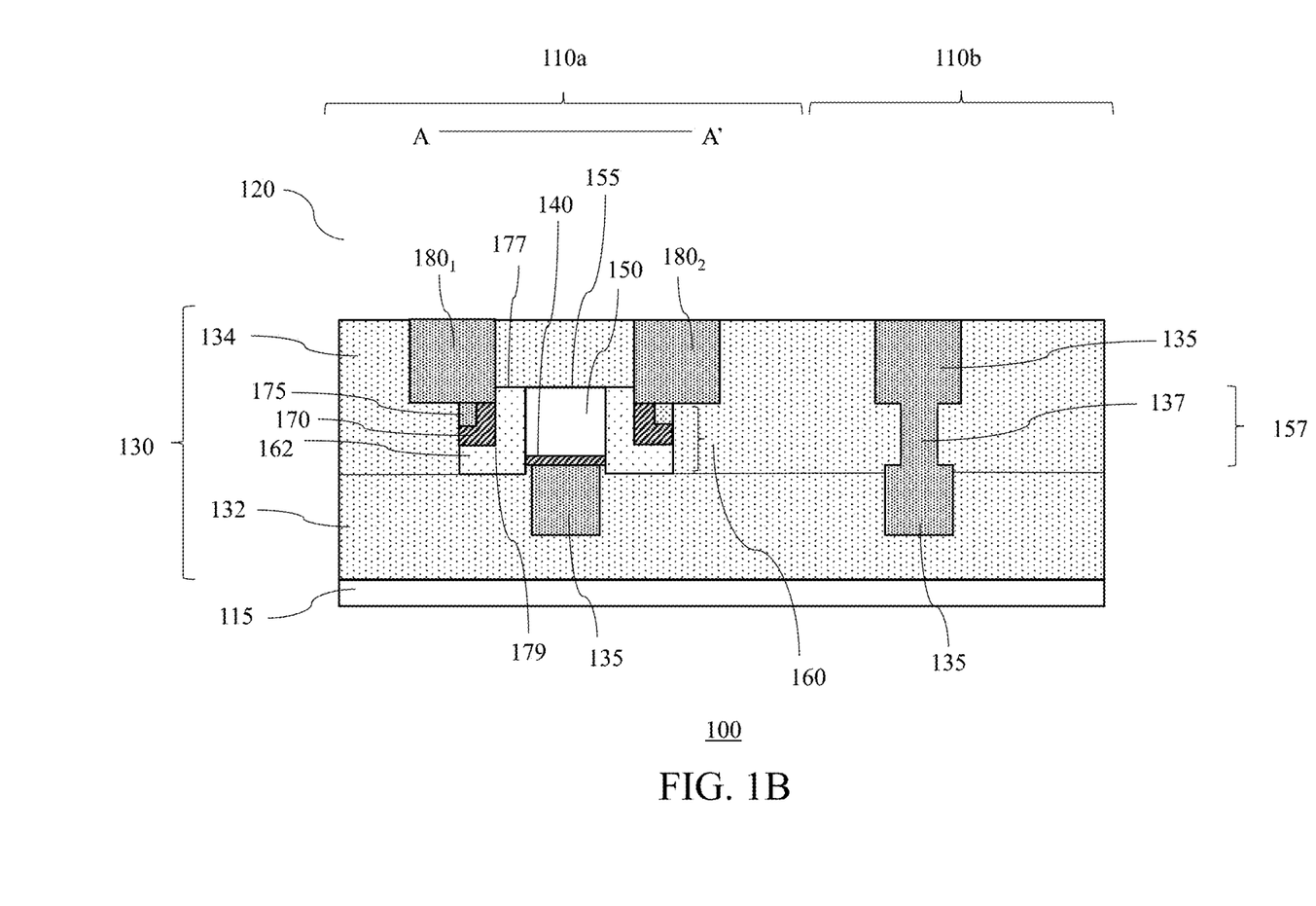
FIG. 1B shows an exemplary cross-sectional view of an embodiment of the device.

FIG. 1A shows a simplified top view of an embodiment of a device 100, while FIG. 1B shows a simplified cross-sectional view of the device 100. The device 100 may be an integrated circuit (IC) having at least a first region 110*a*. In a non-limiting embodiment, the device 100 may be a memory device. For example, the first region 110*a* may include memory cells, which may be RRAM cells, in a non-limiting embodiment. Other types of memory devices, such as MRAMs and/or PCRAMs in other embodiments, may also be useful. Providing the device 100 with other types of device regions (not shown) may also be useful.

Referring to FIG. 1A, the top view shows a portion of a memory array in a first region 110*a* of the device 100. The device 100 may further include other device regions such as a second region which may be a logic region, in a non-limiting example (not shown in FIG. 1A). The memory array may include a plurality of interconnected memory cells 120. The plurality of memory cells may be arranged in first and second directions. The first direction, for example, may include rows of the array, while the second direction may include columns of the array. Alternatively, the first direction may be visualized as columns of the array, while the second direction may be visualized as rows of the array. It is understood that numerous memory cells may be arranged in columns and rows to form the memory array. Further, the array may be configured to have sub-arrays or sectors. Other configurations of the memory cells in the memory array may also be useful.

In a non-limiting embodiment, the memory cells 120 of the array may be interconnected in the second direction by first bit lines (BLs) 122 and second BLs 124. For example, memory cells in each column may be coupled to the first and second BLs 122 and 124. In other words, each memory cell 120 of the array may be coupled to two BLs. As illustrated, memory cells in adjacent columns may be coupled to a common first BL 122. Additionally, memory cells in adjacent columns may be coupled to a common second BL 124 (not shown).

FIG. 1B shows an exemplary cross-sectional view of an embodiment of the device 100 along the second direction. For example, the cross-sectional view shows a portion of an embodiment of the device 100 along the bit line direction. The cross-sectional view illustrates a memory cell 120 in the memory region along the line A-A'.

The device 100 may include a substrate 115. The substrate 115 may be a semiconductor substrate, such as a silicon substrate in a non-limiting embodiment. For example, the substrate may be a lightly doped p-type substrate in a non-limiting embodiment. Providing intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of substrates may also be useful. As illustrated, the device 100 may include the first region 110*a* and the second region 110*b* in a non-limiting embodiment. The first region 110*a* may be a memory region, while the second region 110*b* may be a logic region. The device 100 may include other device regions (not shown).

One or more electronic components (not illustrated) may be formed over and/or within the substrate in the first region 110*a* and the second region 110*b*, as well as other device regions of the device. The electronic components may include, for example, transistors, capacitors, resistors, diodes, or combinations thereof. In some embodiments, the substrate may include isolation regions, such as shallow trench isolation (STI) regions (not shown). The isolation regions, for example, may isolate the first region 110*a* from the second region 110*b* and/or other device regions. The isolation regions, for example, may also isolate columns of memory cells in the memory cell region. Other configurations of isolation regions may also be useful.

An interlevel dielectric (ILD) 130 may be formed over the substrate 115 in the first and second regions 110*a* and 110*b*. For example, the ILD 130 may be formed over the components on the substrate. The ILD 130, for example, may include a plurality of ILD layers. For example, the ILD includes a plurality of ILD levels. The ILD, for example, may be formed by back-end-of-line (BEOL) processing in a non-limiting embodiment. The number of ILD levels may depend on, for example, design requirements or the logic process involved. The ILD layers of the ILD 130, for example, may be formed of one or more dielectric materials, such as low-k dielectric (e.g., SiCOH), silicon oxide, silicon nitride and etc. The dielectric layers may be formed by plasma-enhanced chemical vapor deposition (PECVD), in a non-limiting example. Other suitable material and techniques for forming the ILD layers may also be useful. One or more dielectric layers of the ILD 130 may herein be referred to as a base dielectric layer 132, which is arranged over the substrate 115. In other words, the base dielectric layer 132, for example, may be or include one or more lower and/or intermediate ILD levels of the ILD 130. An upper dielectric layer 134 may be arranged over the base dielectric layer 132. For example, the upper dielectric layer 134 may be or include one or more intermediate and/or upper ILD levels of the ILD 130.

The ILD 130 may include interconnects disposed in the ILD layers (not fully illustrated in the interest of brevity). The interconnects may connect the various components of the IC to perform the desired functions. For example, an ILD level may include a metal level and a contact level in the first and second regions 110a and 110b. For example, a metal level may include conductors or metal lines 135, while the contact level may include via contacts 137. It is understood that there could be a plurality of metal lines in the same metal level of the first and second regions 110a and 110b. The conductors and contacts may be formed of a conductive material, such as copper, copper alloy, aluminum, tungsten, cobalt, ruthenium, or a combination thereof. Other suitable types of metal, alloys, or conductive materials may also be useful. In some cases, the conductors and contacts may be formed of the same material. For example, in upper levels of the interlevel dielectric 130, the conductors and via contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. As illustrated in FIG. 1B, the base dielectric layer 132 includes interconnects (e.g., metal lines 135) disposed in the first and second regions 110a and 110b.

The device 100 may include a plurality of memory cells arranged in the first region 110a. In a non-limiting embodiment, a memory cell may include a resistive switching element arranged between a first electrode and a second electrode. The plurality of memory cells, for example, may be arranged over the base dielectric layer 132. As shown in FIG. 1B, a memory cell may include a first electrode 140 arranged over an interconnect 135 in the first region 110a. As illustrated, the first electrode 140 may be arranged over the interconnect 135 in the base dielectric layer 132. In a non-limiting embodiment, the first electrode 140 may be a barrier layer. For example, the first electrode 140 may be a barrier layer in the case the interconnect 135 is formed of copper (Cu). The barrier layer may prevent out-diffusion of copper in the case the interconnect 135 is formed of Cu. The barrier layer may be formed of a conductive material, such as tantalum nitride (TaN), ruthenium (Ru), cobalt (Co), titanium nitride (TiN), manganese (Mn), tungsten (W) or a combination thereof. Other types of material for the barrier layer may also be useful. In another non-limiting embodiment, the first electrode 140 may be a bottom electrode. For example, the first electrode 140 may be a bottom electrode layer in the case the interconnect 135 is formed of conductive material other than Cu, such as W. The bottom electrode may be or include a conductive material, such as Ta, Ti, TaN, TiN, W or a combination thereof. Other types of material suitable for the bottom electrode may also be useful.

In a non-limiting embodiment, a mask structure 150 may be arranged over the first electrode 140. Referring to FIGS. 1A and 1B, the mask structure 150 may be a pillar in a non-limiting embodiment (e.g., a vertical dimension of the mask structure is more pronounced than its width and length dimensions). For example, the mask structure 150 may have a vertical column shape. In a non-limiting example, the mask structure 150 may have a cylindrical shape. Other shapes, such as a prism in a non-limiting example, for the mask structure may also be useful. The pillar configuration of the mask structure 150 may be obtained by mask and etch techniques in a non-limiting example. A top surface 155 of the mask structure 150 may be substantially planar. The sidewalls of the mask structure 150 may be aligned with the sidewalls of the first electrode 140. In a non-limiting embodiment, the mask structure 150 may be a hard mask. The mask structure 150 may be formed of one or more dielectric materials, such as silicon oxide, silicon nitride, or combinations thereof, in a non-limiting example. In some embodiments, a critical dimension of the mask structure 150 may be smaller than a critical dimension of the first electrode 140. For example, the sidewalls of the mask structure 150 may have a slanted profile. For example, the mask structure 150 may have a smaller dimension at its top portion relative to its bottom portion (the portion nearer to the first electrode may be referred to as the bottom portion). For example, the critical dimension of the mask structure 150 may be smaller than the critical dimension of the first electrode 140 by about 3 nm to 10 nm. The critical dimension of the mask structure 150 may be smaller than the critical dimension of the first electrode 140 in the case an aggressive wet clean process is performed after patterning of the mask structure 150.

In a non-limiting embodiment, a total height of the mask structure 150 and the first electrode 140 in the first region 110a may be greater than a height of a via contact 137 in the second region 110b. For example, the total height of the mask structure 150 and the first electrode 140 may be greater than the height of the via contact 137 in the second region 110b within the same ILD level 157 in the ILD 130 (or within the upper dielectric layer 134).

In a non-limiting embodiment, the device 100 may include at least one spacer stack 160 arranged at least partially around the mask structure 150 and the first electrode 140. In a non-limiting embodiment, a spacer stack 160 may include a resistive switching element 162 and a second electrode 170. In some embodiments, the spacer stack may further include a spacer dielectric layer 175 arranged over the second electrode 170.

The resistive switching element 162 at least partially lines sidewalls of the first electrode 140 and the mask structure 150. In some embodiments, the resistive switching element 162 may completely line sidewalls of the first electrode 140 and the mask structure 150. In a non-limiting embodiment, a top surface 177 of the resistive switching element 162 may be substantially planar with a top surface of the mask structure 150, as illustrated in FIG. 1B. In a non-limiting embodiment, the resistive switching element 162 may have a first portion and a second portion. The first portion of the resistive switching element 162 may at least partially line sidewalls of the first electrode 140 and the mask structure 150, while the second portion of the resistive switching element 162 may be arranged over the base dielectric layer 132. For example, the first portion may be a vertical portion, while the second portion may be a horizontal portion. Other configurations may also be useful.

In a non-limiting embodiment, the resistive switching element 162 may be a variable resistive dielectric layer. For example, the resistive switching element 162 may have a resistance that may be selectively set to various values, and reset, by applying appropriate signals (e.g., a set voltage and a reset voltage). In a non-limiting example, the resistive switching element 162 may be formed of one or more layers of silicon oxide, silicon nitride, germanium oxide (GeOx), gadolinium oxide (GdOx), magnesium oxide (MgOx), lanthanum oxide (LaOx), a transition metal oxide (TMOx) such as, but not limited to, hafnium oxide (HfOx), tantalum oxide (TaOx), titanium oxide (TiOx), molybdenum (MoOx), yttrium oxide (YOx), zirconium oxide (ZrOx), niobium oxide (NbOx), or combinations thereof. Other suitable types of materials for the resistive switching element 162 may also be useful.

The resistive switching element 162 may have a thickness greater than a thickness of the first electrode 140. In a non-limiting example, the resistive switching element 162 may have a thickness ranging from about 15 nm to about 50 nm. In a non-limiting embodiment, a thickness of the resistive switching element 162 to a thickness of the first electrode 140 may have a ratio ranging from of about 1.5:1 to about 5:1.

As for the second electrode 170, it may be arranged over the resistive switching element 162. The second electrode 170 may be arranged conformally over the resistive switching element 162. In a non-limiting embodiment, the second electrode 170 may be a top electrode of the memory cell 120. The second electrode 170 may be or include a conductive material such as Cu, silver (Ag), W, Ta, Ti, TaN, TiN, Ru, platinum (Pt), gold (Au), palladium (Pd), aluminium (Al), nickel (Ni), zirconium nitride (ZrN$_x$), indium tin oxide (ITO), or a combination thereof. The material of the second electrode 170 may depend on the material of the resistive switching element and type of resistive switching. Other types of material suitable for the second electrode may also be useful.

In a non-limiting example, the resistive switching element 162 and the second electrode 170 may have an L-profile or shape. The second electrode 170 of a spacer stack 160 may include an inner tip 179 that points towards a tip of the first electrode 140 to provide a small or confined switching region via the resistive switching element 162. For example, the first electrode 140 and the second electrode 170 provide a tip-to-tip conductive pathway through the resistive switching element 162. This may facilitate a confined switching region in the resistive switching element 162 between the first electrode and the second electrode 140 and 170, which improves uniformity in the switching characteristic of the device 100.

As for the spacer dielectric layer 175 in the spacer stack, it may be formed of silicon oxide, in a non-limiting example. Other types of oxide material for the spacer dielectric layer 175 in the spacer stack may also be useful. In a non-limiting embodiment, a top surface of the second electrode 170 and the spacer dielectric layer 175 may be below the top surface 155 of the mask structure 150.

In a non-limiting embodiment, the spacer stack(s) 160 may include a first spacer stack portion arranged on a first sidewall portion and a second spacer stack portion arranged on a second sidewall portion of the mask structure 150 and the first electrode 140. In a non-limiting embodiment, the second electrode 170 and the spacer dielectric layer 175 partially surround the mask structure 150 and the first electrode 140. For example, the second electrode 170 and the spacer dielectric layer 175 may each include a first portion and a second portion, forming a first spacer stack portion arranged on a first sidewall portion and a second spacer stack portion arranged on a second sidewall portion of the mask structure 150 and the first electrode 140.

The device 100 may include interconnects, such as metal lines 180, disposed over the spacer stack(s) 160. In a non-limiting embodiment, the metal lines 180 may be arranged over the top surface of the second electrode 170 and the spacer dielectric layer 175. For example, the metal lines 180 abut the top surface of the second electrode 170 and the spacer dielectric layer 175. The interconnect 180 may further abut a portion of the resistive switching element 162, as illustrated in FIG. 1B. The metal lines 180 disposed over the spacer stack(s), for example, may be formed in the upper dielectric layer 134. In some embodiments, the metal lines 180 may be disposed in upper levels of the ILD. In some embodiments, the metal lines 180 disposed over the spacer stack(s) 160 may be formed simultaneously with interconnects (e.g., metal line 135 and via contact 137) in the second region 110*b*.

The interconnects 180 may be coupled to bit lines. In a non-limiting embodiment, the interconnects 180 may be coupled to a first BL and a second BL (e.g., first interconnect 180$_1$ and second interconnect 180$_2$ may be coupled to a first BL and a second BL respectively). For example, the second electrodes 170 in the spacer stack(s) 160 may be coupled to the first BL and the second BL (e.g., second electrode 170 in the first spacer stack portion may be coupled to the first BL, while the second electrode 170 in the second spacer stack portion may be coupled to the second BL). In some embodiments, the interconnect 135 under the first electrode 140 may be coupled to a word line (WL) in a non-limiting example. A plurality of the memory cells 120 may form a cross-point array in the first region 110*a*. The interconnect 135 under the first electrode 140 of a memory cell may be a shared contact of the memory cell, which is coupled to the first BL and the second BL.

Figure 1C:
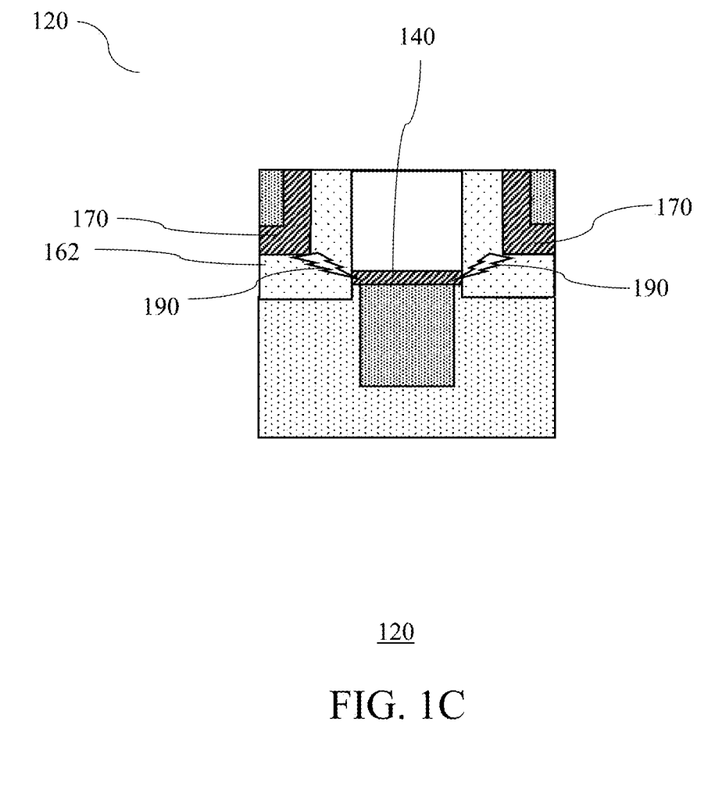
FIG. 1C shows a cross-sectional view of a portion of a memory cell when the memory cell is in use.

FIG. 1C shows a cross-sectional view of a portion of the memory cell 120 when the memory cell 120 is in use. For example, a sufficient voltage may be applied to the first and second electrodes 140 and 170 to form one or more conductive pathways 190 in the resistive switching elements 162. Through the appropriate application of various signals (e.g., a set voltage and reset voltage), the conductive pathways may be modified to form a high resistance state or a low resistance state. For example, a resistive switching element may have a resistance that can be selectively set to various values, and reset, by applying a set voltage, and a reset voltage.

The switching regions in which conductive pathways 190 may be formed are protected from etch processes. In other words, the switching regions formed by the spacer stack(s) 160 are not exposed to etch processes and therefore free of etch damage caused by etch processes. Further, the conductive pathways 190 are confined to small switching regions via the tip-to-tip edges of the first and second electrode, which improves uniformity in the switching characteristic of the memory device. Additionally, an area of the first electrode 140 exposed to or in contact with the resistive switching layer 162 is not restricted by lithography process limitation. Each memory cell 120 of the memory device is capable of storing more than one bit of information. For example, each memory cell 120 of the memory device may be capable of storing two bits of information. This advantageously provides a high density memory array. Other configurations may also be useful. In other embodiments, where the memory cells exhibit multi-level resistance, a plurality of bits may be stored at each cell.

In other embodiments, the resistive switching elements 162 may be magnetic tunneling junction (MTJ) elements or stacks. For example, the resistive switching element 162 may include one or more tunneling barrier layers and a magnetically free layer. Other suitable types of memory elements may also be useful.

FIGS. 2A-2E show simplified cross-sectional views of an embodiment of a process 200 for forming a device. The cross-sectional views of the process 200 are taken along the second direction, such as the bit line direction. In a non-limiting embodiment, the process forms one or more memory cells in a first region of the device. The device formed, for example, is similar or the same as that shown and described in FIGS. 1A-1C. As such, common elements may not be described or described in detail.

Figure 2A:
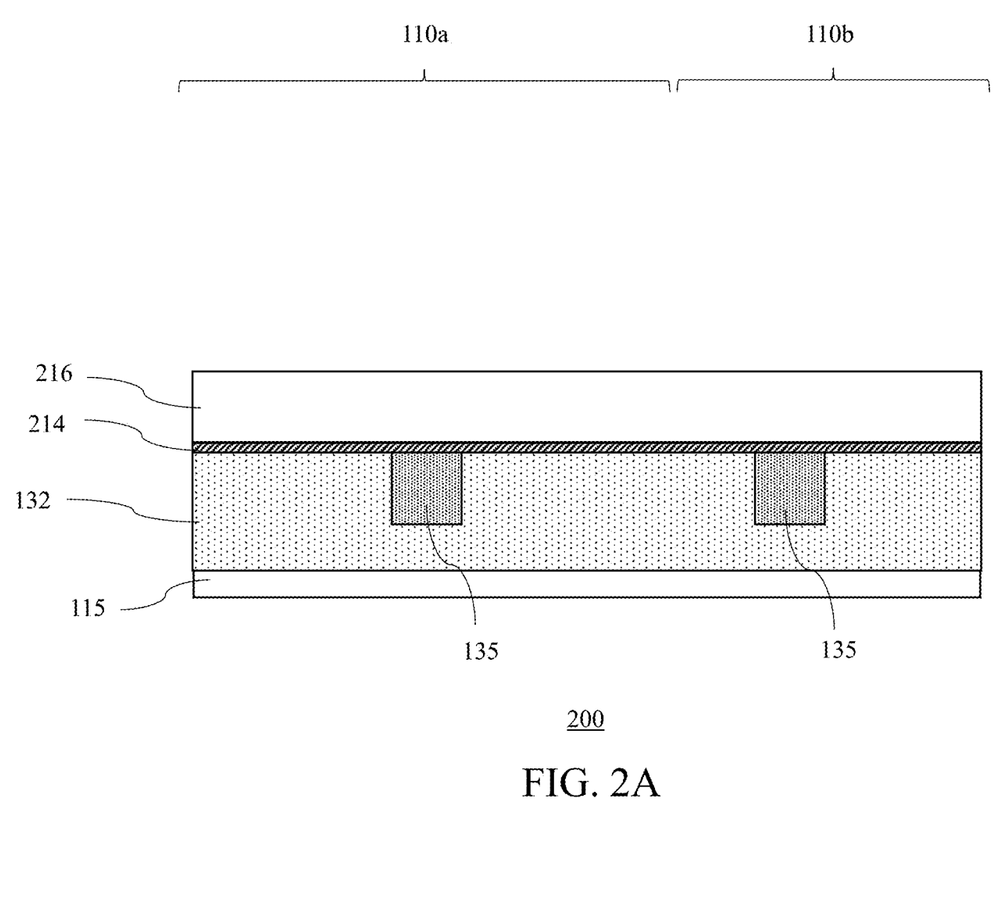
FIGS. 2A-2E show simplified cross-sectional views of an embodiment of a process for forming a device.

A substrate 115 may be provided. The substrate 115 may be a semiconductor substrate, such as a silicon substrate in a non-limiting embodiment. For example, the substrate may be a lightly doped p-type substrate in a non-limiting embodiment. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. Other types of substrates may also be useful. As illustrated, the device 100 includes a first region 110a and a second region 110b in a non-limiting embodiment. The first region 110a may be a memory region, while the second region 110b may be logic region. The device 100 may include other device regions (not shown). For simplicity of discussion and in interest of brevity, the processing of a substrate 115 to form electronic components, such as transistors, are not shown.

In some embodiments, a base dielectric layer 132 may be arranged over the substrate. In a non-limiting example, the base dielectric layer 132 may be or include one or more dielectric layers of an ILD. For example, one or more lower and/or intermediate ILD levels of the ILD may be formed over the substrate 115. The base dielectric layer 132 may be formed using BEOL processing, in a non-limiting example. The base dielectric layer 132 may include interconnects (e.g., metal lines and via contacts) in the first region 110a and in the second region 110b. For example, the interconnects may be coupled to electronic components over and/or within the substrate by other metal lines and via contacts.

The base dielectric layer 132, for example, may be formed of a dielectric material, such as but not limited to, silicon oxide, silicon nitride, low-k dielectric materials such as SiCOH, or combinations thereof. For example, the base dielectric layer 132 may be patterned to form vias and trenches. Conductive material may be deposited over the base dielectric layer 132, and a planarization process may be performed to form interconnects in the base dielectric layer 132. In a non-limiting example, the conductive material may be copper, aluminum, tungsten, cobalt, ruthenium, alloys thereof, or a combination thereof. Other suitable conductive materials may also be employed. It is understood that there may be any suitable number of metal lines and via contacts formed in the base dielectric layer 132 in the first and second regions 110a and 110b. The topmost interconnect (e.g., metal line 135) in the first region 110a may be exposed. The exposed interconnect 135 in the first region 110a may serve as a bottom contact of the subsequently formed memory cell. As for the interconnect (e.g., metal line 135) in the second region 110b, it may be exposed in some embodiments. In other embodiments, the interconnect in the second region 110b may be protected by a barrier layer from an additional deposition or patterning process.

In a non-limiting embodiment, a first electrode may be formed over the interconnect in the first region 110a, and a mask structure may be formed over the first electrode. As shown in FIG. 2A, a first electrode layer 214 may be deposited over the base dielectric layer 132. The first electrode layer 214 may be formed over the base dielectric layer 132 covering a top surface of the metal lines 135. In a non-limiting embodiment, the first electrode layer 214 may be a barrier layer. For example, the first electrode may be a barrier layer in the case the interconnect 135 in the first region 110a is formed of copper. For example, a material of the first electrode layer 214 may be Ta, Ti, TaN, TiN, W or a combination thereof. Other suitable types of material for the first electrode layer may also be useful. In another non-limiting embodiment, the first electrode layer 214 may be an electrode layer for a bottom electrode of the memory cell. For example, the first electrode layer 214 may be an electrode layer in the case the interconnect 135 is formed of conductive material other than Cu, such as W. The electrode layer may be or include a conductive material, such as Ta, Ti, TaN, TiN, W, or a combination thereof. Other types of material suitable for the electrode layer may also be useful. The first electrode layer 214 may be formed, for example, by chemical vapor deposition (CVD). Other suitable materials and deposition techniques for the first electrode layer may also be useful.

A mask layer 216 may be formed over the first electrode layer 214. In a non-limiting embodiment, the mask layer 216 may be a hard mask layer. The mask layer 216 may be formed by depositing one or more dielectric layers, such as silicon oxide, silicon nitride, or combinations thereof, in a non-limiting example. The mask layer 216, for example, may be formed by plasma-enhanced chemical vapor deposition (PECVD). Other suitable techniques and materials for forming the mask layer 216 may also be useful.

Figure 2B:
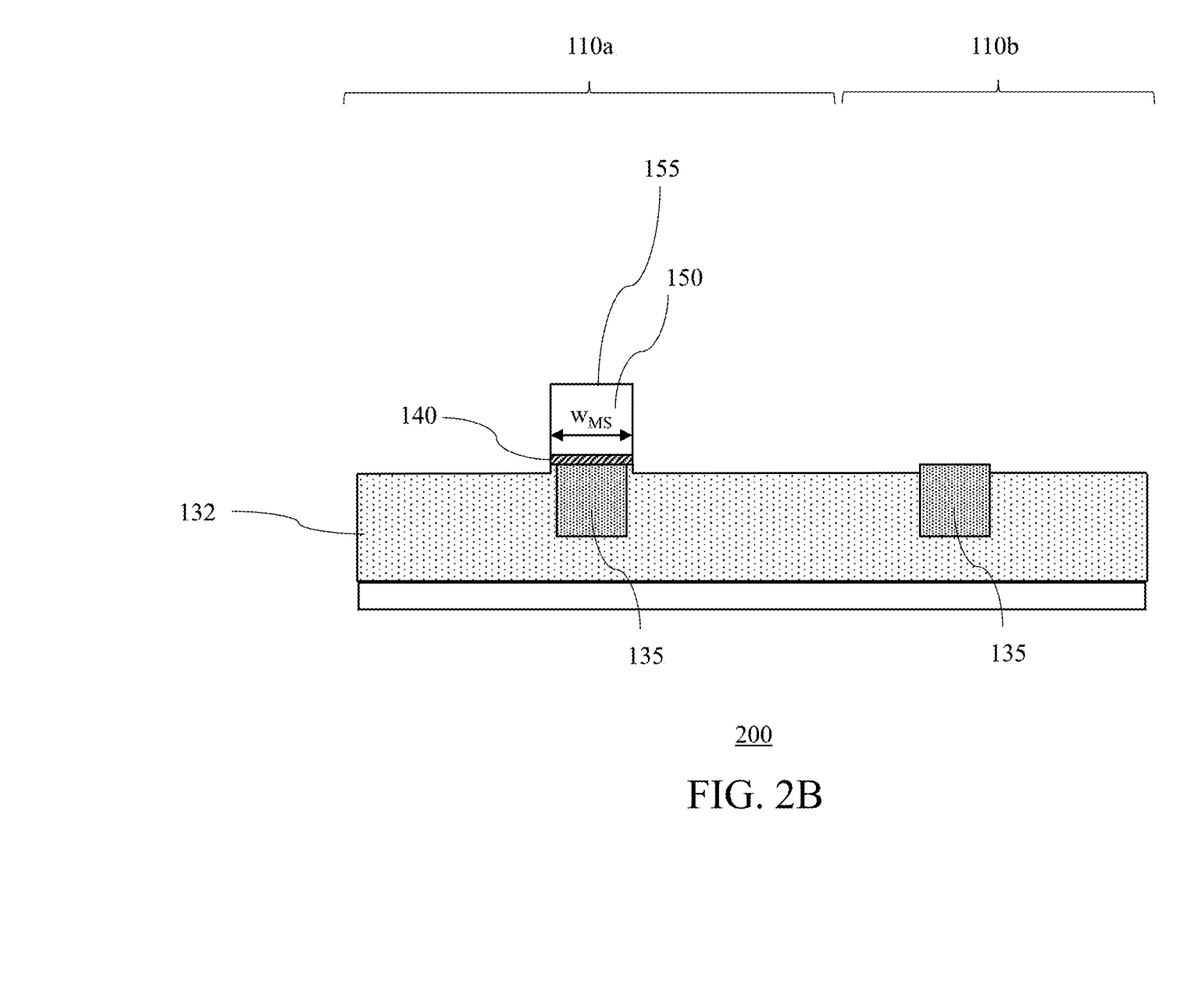

The first electrode layer 214 and mask layer 216 may be patterned to form the first electrode 140 and the mask structure 150 in the first region 110a, as illustrated in FIG. 2B. In a non-limiting embodiment, the mask layer 216 may be patterned to form the mask structure 150. The mask structure 150 may be a pillar. In a non-limiting embodiment, the first electrode layer 214 and mask layer 216 may be patterned by lithography and etch techniques. For example, a soft mask layer, such as a photoresist layer may be formed over the mask layer 216. The photoresist layer may be deposited by spin coating and patterned to form a pattern used to define the first electrode layer 214 and the mask layer 216. The photoresist may be selectively exposed with an exposure source using a reticle (not shown). The pattern of the reticle is transferred to the photoresist after exposure by a development process. The patterned photoresist may then be used to define the first electrode layer 214 and mask layer 216 by removing portions of the first electrode layer 214 and mask layer 216 not protected by the patterned photoresist. The first electrode layer 214 and mask layer 216 may be etched in the exposed area to form the first electrode 140 and the mask structure 150 in the areas protected by the patterned photoresist. The first electrode layer 214 and mask layer 216 may be etched anisotropically, such as with a plasma dry etch using an inert gas such as argon.

As an example, the first electrode 140 and the mask structure 150 may have the same configuration as that described with respect to FIGS. 1A and 1B. For example, the mask structure 150 may have a vertical column shape. In a non-limiting example, the mask structure 150 may have a cylindrical shape. Other shapes for the mask structure may also be useful. A top surface 155 of the mask structure may be substantially planar. For example, the sidewalls of the mask structure 150 may have a slanted profile. The sidewalls of the mask structure 150 may be aligned with the sidewalls of the first electrode 140. The patterned photoresist may be removed using suitable techniques, such as ashing in a non-limiting embodiment. In some embodiments, a wet clean may be performed after patterning of the first electrode 140 and the mask structure 150. The wet clean forms a critical dimension of the mask structure 150 which may be smaller than a critical dimension of the first electrode 140. For example, the critical dimension of the mask structure 150 may be smaller than the critical dimension of the first electrode 140 by about 3 nm to 10 nm.

The first electrode 140 may serve as a barrier layer or bottom electrode of the memory cell. In a non-limiting embodiment, a total height of the mask structure 150 and the first electrode 140 in the first region 110a may be formed such that it is greater than a height of a subsequently formed interconnect (e.g., via contact) in the second region 110b. In a non-limiting embodiment, a diameter or width $w_{MS}$ of the mask structure 150 may be greater than a width of the interconnect 135 under the first electrode 140. For example, the width $w_{MS}$ of the mask structure 150 may range from about 40 nm to about 150 nm. In a non-limiting embodiment, the interconnect 135 in the second region 110b may be exposed after patterning the mask structure 150. In some embodiments, an additional barrier layer may be formed over the interconnect 135 in the second region 110b (not shown). For example, the additional barrier layer may be formed by selective deposition on the interconnect 135 in the second region 110b if the interconnect 135 is formed of Cu. The additional barrier layer may be formed after patterning of the mask structure 150, in a non-limiting example.

In a non-limiting embodiment, at least one spacer stack may be formed at least partially around the mask structure 150 and the first electrode 140. In a non-limiting embodiment, the spacer stack(s) may include a first spacer stack portion and a second spacer stack portion arranged at least partially around the mask structure 150 and the first electrode 140. In a non-limiting embodiment, the spacer stack(s) may include a resistive switching element and a second electrode. In some embodiments, the spacer stack(s) may further include a spacer dielectric layer arranged over the second electrode.

Figure 2C:
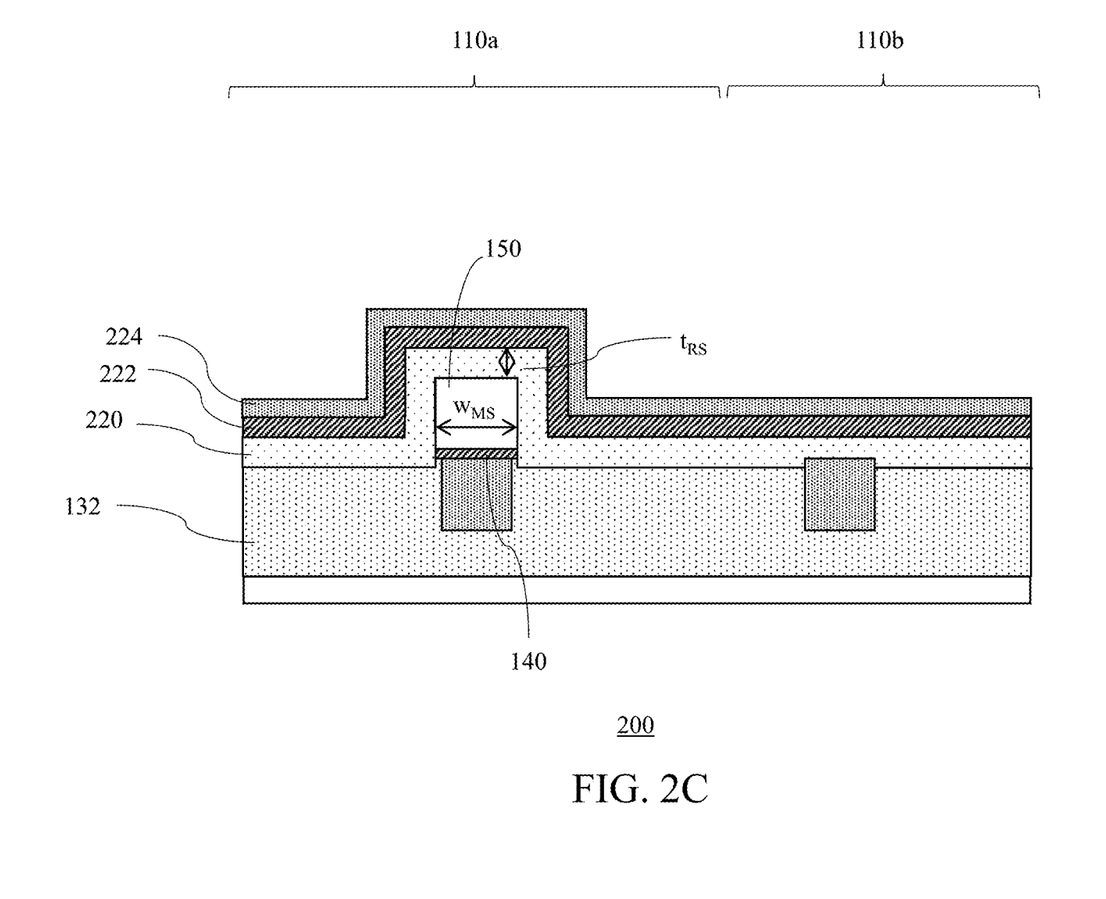

As illustrated in FIG. 2C, a resistive switching layer 220 for the resistive switching element of the spacer stack(s) may be formed over the base dielectric layer 132 and the hard mask structure 150. The resistive switching layer 220 may be a variable resistive dielectric layer. In a non-limiting example, the resistive switching layer 220 may be formed of one or more layers of silicon oxide, silicon nitride (SiN), GeOx, GdOx, MgOx, LaOx, a transition metal oxide (TMOx) such as, but not limited to, HfOx, TaOx, TiOx, MoOx, YOx, ZrOx, NbOx, or combinations thereof. The resistive switching layer 220, for example, may be formed by CVD, physical vapor deposition (PVD), or atomic layer deposition (ALD). Other suitable techniques and materials for the resistive switching layer 220 may also be useful. The resistive switching layer 220 may be deposited to a thickness ranging from about 15 nm to about 50 nm. The resistive switching layer 220 may have a thickness $t_{RS}$ greater than a thickness of the first electrode 140. For example, the resistive switching layer 220 may have a thickness $t_{RS}$ ranging from about 10 nm to about 15 nm. In a non-limiting embodiment, a thickness of the resistive switching layer 220 to a thickness of the first electrode may have a ratio ranging from about 1.5:1 to about 5:1.

A second electrode layer 222 for the second electrode of the spacer stack(s) may be formed over the resistive switching layer 220. The second electrode layer 222 may be deposited conformally over the resistive switching layer 220. The second electrode layer 222 may be formed of one or more layers of conductive material, including but not limited to, Cu, Ag, W, Ta, Ti, TaN, TiN, Ru, Pt, Au, Pd, Al, Ni, $ZrN_x$, ITO, or a combination thereof. The material of the second electrode layer 222 may depend on the material of the resistive switching layer and type of resistive switching. Other types of material suitable for the second electrode layer may also be useful.

A spacer dielectric liner or layer 224 of the spacer stack(s) may be formed over the second electrode layer 222. The spacer dielectric layer 224 may be deposited conformally over the second electrode layer 222. The spacer dielectric layer 224 may serve as a dummy layer for a subsequent self-aligned etch process. The spacer dielectric layer 224 may be or include an oxide material, such as silicon oxide, in a non-limiting example. Other types of material suitable for the spacer dielectric layer 224 may also be useful. The second electrode layer 222 and the spacer dielectric layer 224, for example, may be formed by CVD. Other techniques may also be useful.

Figure 2D:
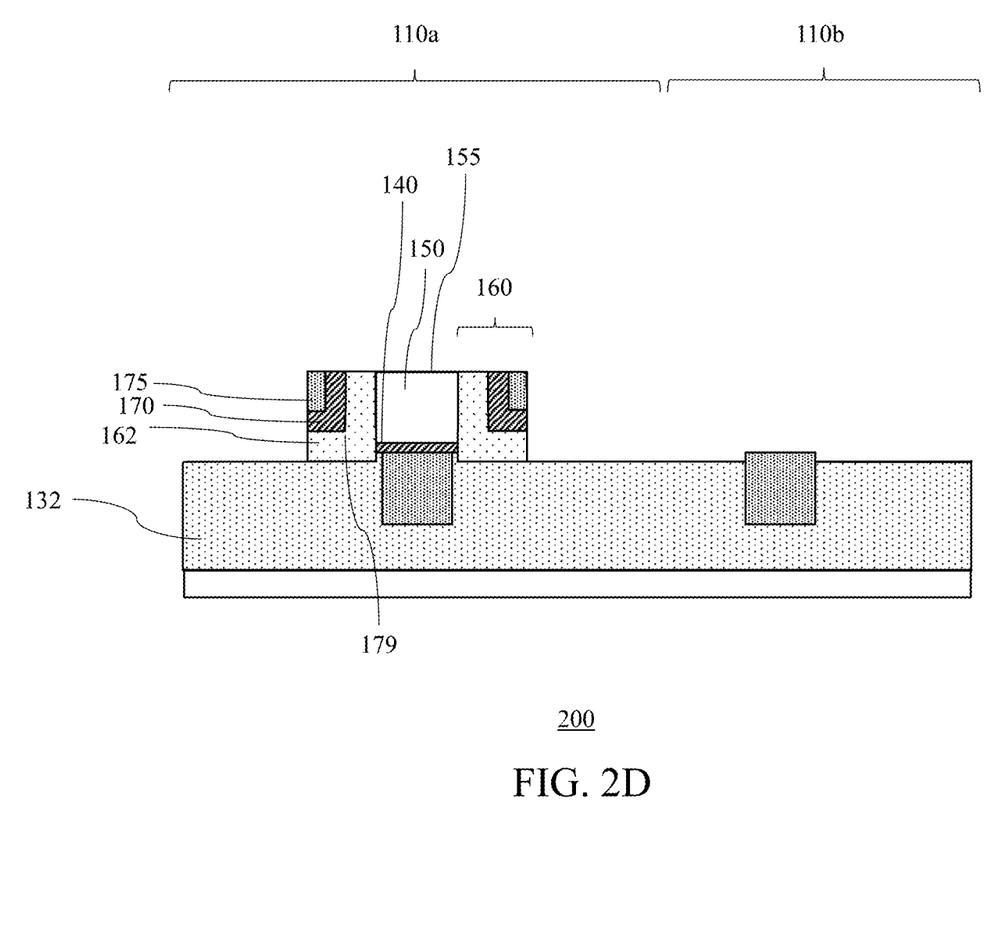

The resistive switching layer 220, the second electrode layer 222 and the spacer dielectric layer 224 may be patterned to form at least one spacer stack 160 at least partially around the mask structure 150 and the first electrode 140. In a non-limiting embodiment, a spacer etch may be performed to form a self-aligned spacer stack 160, as illustrated in FIG. 2D. In a non-limiting embodiment, the etch may be a blanket etch performed to remove portions of the resistive switching layer 220, the second electrode layer 222 and the spacer dielectric layer 224 in the first and second regions 110a and 110b. In a non-limiting embodiment, horizontal portions of the resistive switching layer 220, the second electrode layer 222 and the spacer dielectric layer 224 over the base dielectric layer 132 may be removed during the etch process. In a non-limiting example, the spacer etch to form the at least one spacer stack may be a dry etch such as a reactive ion etch (RIE). In some embodiments where the resistive switching layer 220 is formed of SiN, the spacer etch may stop at the resistive switching layer 220. Other types of etching techniques may also be useful.

In a non-limiting embodiment, the spacer etch removes portions of the resistive switching layer 220, the second electrode layer 222 and the spacer dielectric layer 224 above the mask structure 150 to expose the top surface 155 of the mask structure 150, as illustrated in FIG. 2D. In a non-limiting embodiment, the etch forms a substantially planar top surface between the mask structure 150, the resistive switching layer 220, the second electrode layer 222 and the spacer dielectric layer 224. In a non-limiting embodiment, the self-aligned spacer etch may remove portions of the resistive switching layer 220, the second electrode layer 222 and the spacer dielectric layer 224 at the same time, i.e., a single etch may be used to remove portions of the resistive switching layer 220, the second electrode layer 222 and the spacer dielectric layer 224, forming the spacer stack(s) 160 at least partially around the mask structure 150 and the first electrode 140. The spacer stack(s) 160 may be self-aligned around the mask structure 150 and the first electrode 140 and formed without using a mask in a non-limiting embodiment. In some cases where the resistive switching layer 220 is formed of SiN and the spacer etch stops at the resistive switching layer 220, the top surface 155 of the mask structure 150 may be covered by the resistive switching layer 220 after the spacer etch.

The spacer stack(s) 160 includes the resistive switching element 162, the second electrode 170, and the spacer dielectric layer 175, in a non-limiting embodiment. The spacer dielectric layer 175 protects the underlying resistive switching element 162 and the second electrode 170 during the etch process. The resistive switching element 162 at least partially lines sidewalls of the first electrode 140 and the mask structure 150. In a non-limiting embodiment, the resistive switching element 162 may have a first portion and a second portion. The first portion of the resistive switching element 162 may at least partially line sidewalls of the first electrode 140 and the mask structure 150, while the second portion of the resistive switching element 162 may be arranged over the base dielectric layer 132. For example, the first portion may be a vertical portion, while the second portion may be a horizontal portion. The second electrode 170 may be arranged over the resistive switching element 162. For example, the second electrode 170 may be arranged conformally over the resistive switching element 162. In a non-limiting embodiment, the second electrode 170 may serve as a top electrode of the memory cell. Other configurations may also be useful.

In a non-limiting example, the resistive switching element 162 and the second electrode 170 may have an L-profile or shape. The second electrode 170 may include an inner tip 179 that points towards a tip of the first electrode 140, which facilitates tip-to-tip conductive pathways via the resistive switching element 162. This provides a small or confined switching region via the resistive switching element 162. The switching region in the spacer stack(s) 160 is advantageously not exposed to the etch process for forming the self-aligned spacer stack. This prevents damage to the switching region and enables the switching region to be free of etch damage caused by etching processes.

Figure 3A:
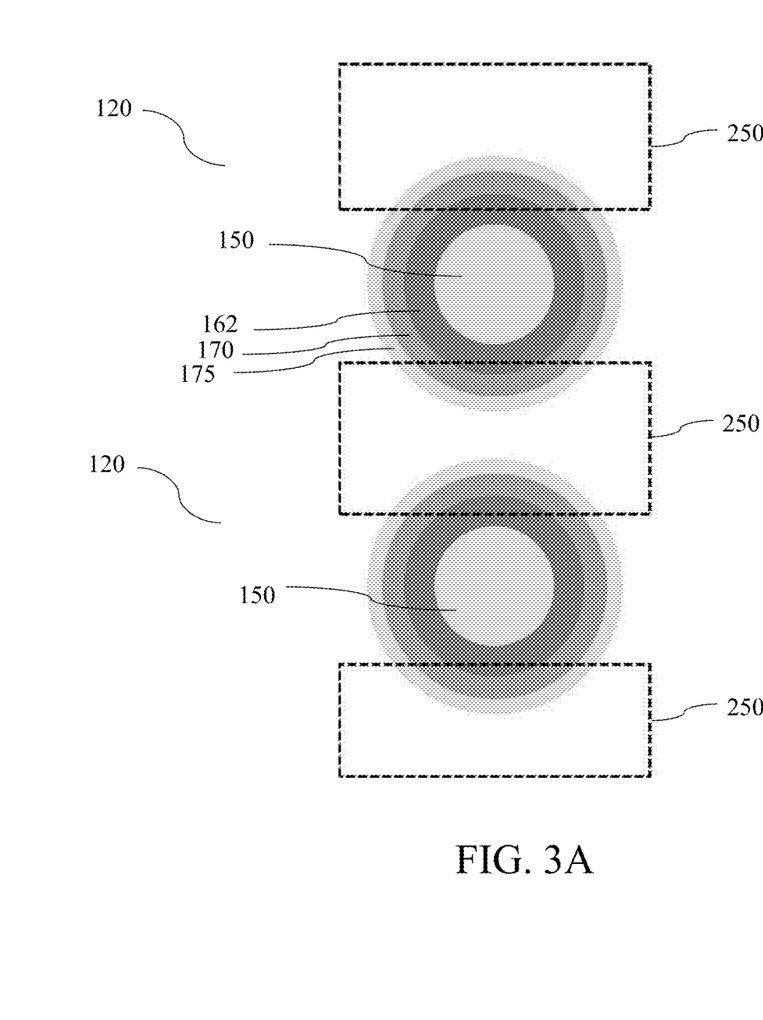
FIG. 3A shows a top view of two memory cells after an etch process for forming at least one spacer stack around a mask structure.

The process continues by performing a sidewall cut of the memory cell in the first direction. For example, the first direction may be in a perpendicular axis to the second direction. For example, the first direction may be a WL direction of the memory array. The sidewall cut 250 removes portions of the spacer stack(s) on first and second sides of the mask structure 150, as illustrated in FIG. 3A. FIG. 3A shows a top view of two memory cells 120 after the spacer etch process for forming the spacer stack(s) around the mask structure 150. For example, the spacer stack(s) completely surrounds sidewall(s) of a mask structure 150 (and a first electrode). As illustrated in FIG. 3A, the resistive switching element 162, the second electrode 170, and the spacer dielectric layer 175 of the spacer stack(s) completely surrounds the sidewall(s) of a mask structure 150. A sidewall cut 250 may be performed in the first direction to remove portions of the second electrode 170 on first and second sides of mask structures 150. The sidewall cut may be performed, for example, by lithography and etch (e.g., RIE).

Figure 3B:
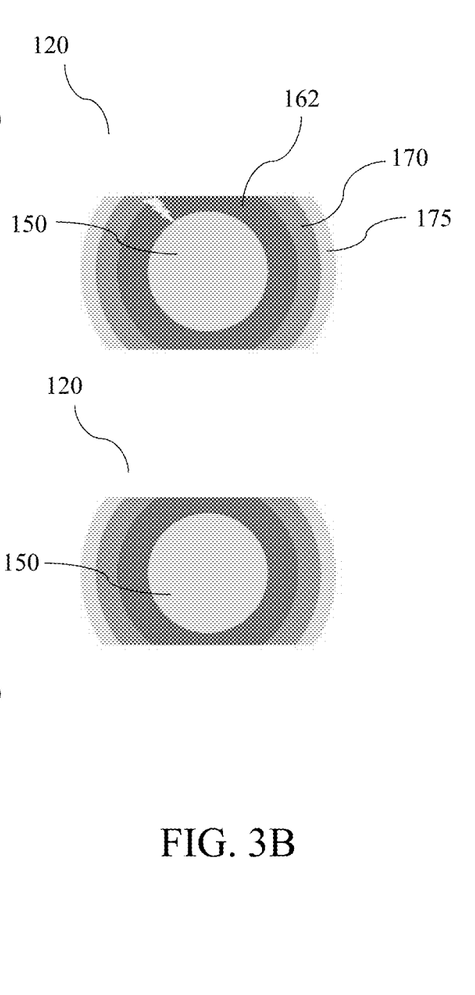
FIG. 3B shows a top view of two memory cells after a sidewall cut of the spacer stacks.

FIG. 3B shows a top view of two memory cells 120 after the sidewall cut of the spacer stacks around the mask structure 150. As illustrated, portions of the second electrode 170 are removed on the first and second side of each mask structure or pillar 150. The resistive switching element 162 may have a sufficient thickness, such that a portion of it remains after the sidewall cut of the second electrode. For example, the resistive switching element 162 completely lines the sidewall(s) of the mask structure 150 and the first electrode 140. The resistive switching element 162 may surround the perimeter of the mask structure 150. The resistive switching element 162 may have a non-uniform width around the perimeter of the mask structure 150 after performing the sidewall cut of the second electrode. In a non-limiting example, a thickness of the resistive switching element to a thickness of the first electrode has a ratio ranging from about 1.5:1 to about 5:1. In a non-limiting embodiment, the second electrode 170 and the spacer dielectric layer 175 partially surrounds the mask structure 150 and the first electrode 140. For example, each of the second electrode 170 and the spacer dielectric layer 175 includes a first portion and a second portion, forming a first spacer stack portion arranged on a first sidewall portion and a second spacer stack portion arranged on a second sidewall portion of the mask structure 150 and the first electrode 140. Each memory cell 120 of the memory array may be capable of storing two bits of information.

Figure 2E:
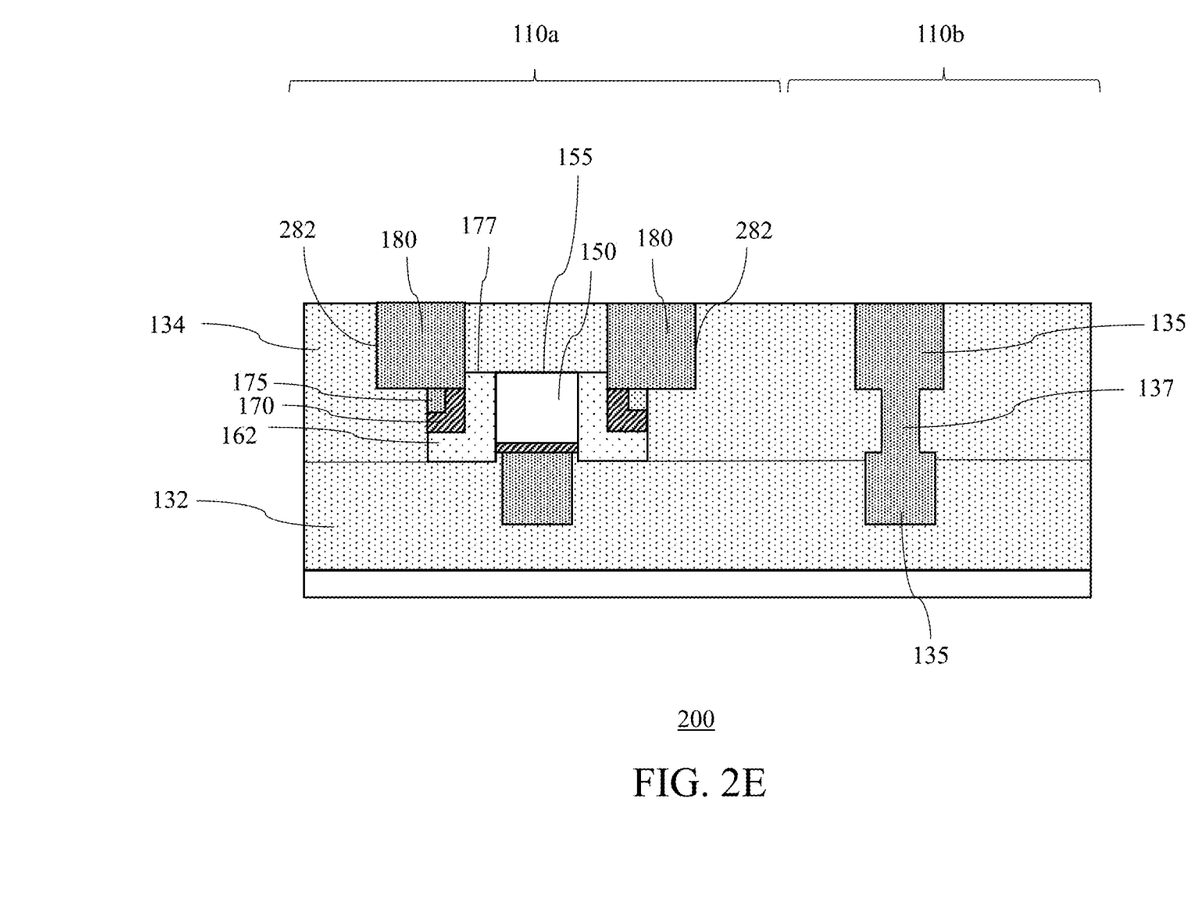

The process may continue to complete forming the memory device. For example, additional interconnects may be formed. The interconnects may couple the memory cells to bit lines. Referring to FIG. 2E, an upper dielectric layer 134 may be formed over the base dielectric layer 132 in the first and second regions 110a and 110b. As illustrated, the upper dielectric layer 134 may cover a top surface 155 of the mask structure 150, and a top surface 177 of the resistive switching layer 162. The upper dielectric layer 134 may be deposited, for example, by PECVD. A planarization process may then be performed to form a substantially planar top surface of the upper dielectric layer 134. For example, the planarization process may form a substantially planar top surface of the upper dielectric layer 134 between the first and second regions 110a and 110b. For example, a planarization process, such as chemical mechanical polishing (CMP) or etch back with organic material coating, may be performed. Other suitable techniques for forming and planarizing the upper dielectric layer 134 may also be useful.

The upper dielectric layer 134 may be formed of the same dielectric material as the base dielectric layer 132. In other embodiments, the upper dielectric layer 134 may be formed of a different dielectric material from the base dielectric layer 132. In a non-limiting example, the upper dielectric layer 134 may be formed of a low-k dielectric material, such as SiCOH. Other suitable materials for forming the upper dielectric layer 134 may also be useful.

Interconnects may be formed in the upper dielectric layer 134 in the first and second regions. In a non-limiting embodiment, dual damascene processes may be employed to form interconnects in the upper dielectric layer 134. The upper dielectric layer 134 may be patterned to form via openings and trenches, for example, by mask and etch techniques. For example, trenches may be formed in the first region 110a for forming interconnects or metal lines 180, while a via opening and a trench may be formed in the second region 110b for forming via contact 137 and metal line 135. For example, a patterned photoresist mask (not shown) may be formed over the upper dielectric layer 134, serving as an etch mask. An etch, for example, may be performed to remove exposed portions of upper dielectric layer 134 to form the via opening for the via contact 137 in the second region 110b. A top surface of the metal line 135 in the base dielectric layer 132 in the second region 110b may be exposed. The patterned mask may be removed using suitable techniques such as ashing, for example.

The upper dielectric layer 134 may be patterned to define trenches for metal lines 180 in the first region 110a and metal line 135 the second region 110b. For example, the upper dielectric layer 134 may be patterned to form trenches in the first and second regions simultaneously. For example, a mask such as a patterned photoresist mask (not shown) may be formed over the upper dielectric layer 134, serving as an etch mask. An etch, for example, may be performed to remove exposed portions of the upper dielectric layer to form the trenches. In a non-limiting embodiment, trenches 282 may be formed in the first region 110a such that portions of the second electrode 170 and spacer dielectric layer 175 are removed, or recessed, below the top surface 155 of the mask structure 150. The patterned mask may be removed using suitable techniques such as ashing, for example.

The process continues to form a conductive layer over the substrate in the first and second regions 110a and 110b. For example, the interconnects in the first region 110a and the second region 110b may be formed simultaneously in the upper dielectric layer 134. The conductive layer covers the upper dielectric layer 134 and fills the trenches and via opening in the upper dielectric layer 134. In a non-limiting example, the conductive layer may be a conductive material, such as Cu. Other suitable types of conductive materials may also be useful. The conductive layer may be formed by, for example, electrochemical plating. Other suitable techniques for forming the conductive layer may also be useful. An anneal may then be performed. Excess conductive material may be removed by planarization, such as CMP, forming metal lines 180 in the first region 110a and metal line 135 the second region 110b. The interconnects may be formed of the same conductive material. Forming interconnects of different conductive material in the first region 110a and the second region 110b may also be useful.

As illustrated in FIG. 2E, interconnects or metal lines 180 may be disposed over the spacer stack(s) 160 of the memory cell. In a non-limiting embodiment, the interconnects or metal lines 180 may be arranged over the top surface of the second electrode 170 and the spacer dielectric layer 175. As illustrated, the interconnect 180 abuts the top surface of the second electrode 170 and the spacer dielectric layer 175. In other words, an edge of a metal line 180 contacts the second electrode 170. The interconnect 180 may further abut a portion of the resistive switching element 162. In a non-limiting embodiment, the total height of the mask structure 150 and the first electrode 140 may be greater than the height of the via contact 137 in the second region 110b within the upper dielectric layer 134.

The process continues to complete formation of the device. The process, for example, may continue to form additional dielectric layer (e.g., upper ILD levels of the ILD) with interconnects in these higher ILD levels. The interconnects or metal lines 180 over the memory cells may be coupled to BLs. For example, the second electrode 170 of each memory cell may be coupled to a first BL and a second BL. For example, the first portion and the second portion of the second electrode 170 (of the first spacer stack portion and the second spacer stack portion) may be coupled to the first BL and the second BL respectively.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate comprising at least a first region;
   a base dielectric layer arranged over the substrate, the base dielectric layer comprises an interconnect in the first region;
   a first electrode arranged over the interconnect in the first region;
   a mask structure arranged over the first electrode;
   at least one spacer stack arranged at least partially around the mask structure and the first electrode, wherein the least one spacer stack comprises
      a resistive switching element at least partially lining sidewalls of the mask structure and the first electrode, and
      a second electrode arranged over the resistive switching element.

2. The device of claim 1, wherein the second electrode of the spacer stack comprises an inner tip that points towards a tip of the first electrode to provide a small switching region via the resistive switching element.

3. The device of claim 1, wherein a top surface of the resistive switching element is substantially planar with a top surface of the mask structure.

4. The device of claim 1, wherein the at least one spacer stack further comprises a dielectric layer arranged over the second electrode.

5. The device of claim 1, wherein the resistive switching element further comprises a horizontal portion over the base dielectric layer, and having an L-shape.

6. The device of claim 1, wherein the mask structure comprises a pillar.

7. The device of claim 1, wherein the mask structure is formed of a dielectric material.

8. The device of claim 1, wherein the second electrode of the at least one spacer stack is arranged partially around the mask structure and the first electrode.

9. The device of claim 1, wherein the first electrode is a bottom electrode.

10. The device of claim 1, wherein the first electrode is a barrier layer.

11. The device of claim 1, wherein a thickness of the resistive switching element to a thickness of the first electrode has a ratio ranging from about 1.5:1 to about 5:1.

12. The device of claim 1, wherein:
   the substrate further comprises a second region;
   an upper dielectric layer arranged over the base dielectric layer and the at least one spacer stack, wherein the upper dielectric layer comprises an interconnect with a via contact in the second region, wherein a height of the mask structure and the first electrode is greater than a height of the via contact.

13. The device of claim 1, wherein the second electrode of the at least one spacer stack is coupled to a first bitline and a second bitline.

14. A method of forming a device, comprising:
   providing a substrate having at least a first region, wherein a base dielectric layer is arranged over the substrate, the base dielectric layer comprises an interconnect in the first region;
   forming a first electrode over the interconnect in the first region;
   forming a mask structure over the first electrode; and forming at least one spacer stack at least partially around the mask structure and the first electrode, wherein the least one spacer stack comprises
a resistive switching element at least lining sidewalls of the mask structure and the first electrode, and
a second electrode arranged over the resistive switching element.

15. The method of claim 14, wherein the second electrode of the spacer stack comprises an inner tip that points towards a tip of the first electrode to provide a small switching region via the resistive switching element.

16. The method of claim 14, wherein forming the at least one spacer stack comprises depositing a resistive switching layer, a second electrode layer, and a spacer dielectric layer over the mask structure, and patterning the resistive switching layer, the second electrode layer, and the spacer dielectric layer to form a top surface of the resistive switching element substantially planar with a top surface of the mask structure.

17. The method of claim 14, wherein the resistive switching element further comprises a horizontal portion over the base dielectric layer, forming an L-shape resistive switching element.

18. The method of claim 14, wherein the mask structure comprises a pillar.

19. The method of claim 14, wherein:
the substrate further comprises a second region;
forming an upper dielectric layer over the base dielectric layer and the at least one spacer stack;
forming an interconnect with a via contact in upper dielectric layer in the second region, wherein a height of the mask structure and the first electrode is greater than a height of the via contact.

20. The method of claim 14, wherein a thickness of the resistive switching element to a thickness of the first electrode has a ratio ranging from about 1.5:1 to about 5:1.

* * * * *